United States Patent [19]

Hoffman et al.

[11] 4,004,057

[45] Jan. 18, 1977

[54] GOLD CONDUCTOR COMPOSITIONS

[75] Inventors: Lewis Charles Hoffman, Hockessin; Charles William McMunn, New Castle; Arthur Harvey Mones, Wilmington, all of Del.; Oliver Alton Short, Hemel Hempstead, England

[73] Assignee: E. I. DuPont de Nemours and Company, Wilmington, Del.

[22] Filed: Mar. 12, 1976

[21] Appl. No.: 666,496

Related U.S. Application Data

[62] Division of Ser. No. 588,131, June 23, 1975, Pat. No. 3,970,590.

[52] U.S. Cl. .................................. 428/209; 106/1; 106/53; 252/514; 428/434; 428/457; 428/469; 428/471; 428/472

[51] Int. Cl.$^2$ ..................... H01B 1/02; H01B 1/06; B32B 15/00

[58] Field of Search .......... 428/434, 469, 471, 472, 428/457, 208, 209; 106/1, 53; 252/514

[56] References Cited

UNITED STATES PATENTS

| | | | |
|---|---|---|---|
| 3,799,890 | 3/1974 | Smith | 252/514 |
| 3,799,891 | 3/1974 | Smith | 106/1 X |
| 3,827,891 | 8/1974 | Larry | 252/514 X |
| 3,935,366 | 1/1976 | Smith | 428/434 X |

*Primary Examiner*—Harris A. Pitlick

[57] ABSTRACT

This invention relates to dispersions of gold and a certain inorganic binder in an inert liquid vehicle, useful in the electronics art for producing conductor patterns adherent to substrates. Small amounts of the binder are effective in producing excellent adhesion to substrates, such as ceramic substrates. The binders comprise certain amounts of the crystalline materials $PbF_2$, $Cu_2O$, and $CdO$, in addition to a glass of, by weight, 45–52% $PbO$, 3–6% $B_2O_3$, 30–35% $SiO_2$, 4–6% $TiO_2$, 2–4% $ZrO_2$, 0–1% $ZnO$, 1–4% $Na_2O$, 0–4% $CdO$, and 0–2% $Li_2O$.

4 Claims, No Drawings

GOLD CONDUCTOR COMPOSITIONS

This is a division of application Ser. No. 588,131, filed June 23, 1975 and now U.S. Pat. No. 3,970,590.

BACKGROUND OF THE INVENTION

This invention relates to electronics, and more particularly to noble metal compositions useful for producing conductor patterns adherent to substrates.

Conductor compositions which are applied to and fired on ceramic dielectric substrates usually comprise finely divided noble metal particles and inorganic binder particles, and are commonly applied to substrates using so-called "thick film" techniques, as a dispersion of inorganic powders in an inert liquid medium or vehicle. The metallic component of the composition provides the functional (conductive) utility, while the inorganic binder (e.g., glass, $Bi_2O_3$, etc.) bonds the metal particles to one another and to the substrate. Thick film techniques are contrasted with "thin film" techniques, which involve deposition of particles by evaporation or sputtering. Thick film techniques are discussed generally in "Handbook of Materials and Processes for Electronics" C. A. Harper, Editor, McGraw-Hill, N.Y., 1970, Chapter 12.

Martin U.S. Pat. No. 3,293,501 discloses the manufacture of conductive films of noble metals plus copper glasses. Buck U.S. Pat. No. 3,776,769 discloses conductor compositions (which are fired in reducing atmospheres) of noble metal, 1-50% copper or its oxide(s), and vitreous binder. The necessity of firing in an atmosphere other than air is a distinct commercial drawback. Finally, Short U.S. Pat. No. 3,350,341 discloses silver compositions comprising a $PbF_2$-containing glass.

Glass-containing gold compositions presently available often contain large amounts of glass binder, which interferes with beam lead repair (beam leads are wires attached to conductor patterns on a substrate).

Noble metal conductor compositions employing a glass-free binder include the following. White U.K. Pat. No. 855,625, relates to the use of compositions of, e.g., silver plus copper oxide plus a minor proportion of a third "inert" material capable of being wetted by molten silver and copper oxide. The inert material may be alumina, magnesia, zirconia, titania, chromic oxide, or alumina-silicate. The firing temperatures are above 940° C., preferably between 1000°–1100° C. No "inert" material which melts at the firing temperature is suggested. Glass-free conductor compositions of silver plus copper oxide have been an article of commerce for at least 15 years, and of gold plus copper oxide for more than 6 years. Gucker et al., Am.Ceram.Soc.Bull. 46, 789 (1967) disclose conductor compositions of gold and copper oxide. Smith U.S. Pat. Nos. 3,799,890 and 3,799,891 disclose glass-free gold conductor compositions using a copper oxide binder, and in 3,799,891, cadmium oxide also. Sheard U.S. Pat. No. 3,763,409, discloses capacitor electrode compositions including those of palladium or palladium oxide and copper or copper oxide.

Glass-free gold conductor compositions, although they may require smaller amounts of binder than conventional glass-bonded compositions, often must be fired at higher temperatures than the glass-bonded systems to achieve similar adhesion levels. Furthermore, gold/copper oxide compositions require chemical cleaning prior to thermal compression bonding.

There is a need in the electronics industry for gold conductor compositions comprising small amounts of binder, but which can yield good adhesion at low firing temperatures. The fired conductor should accept thermal compression binding readily, preferably without chemical precleaning, and should also permit beam lead repairs.

SUMMARY OF THE INVENTION

This invention relates to compositions of finely divided gold particles and finely divided inorganic binder particles dispersed in an inert liquid vehicle. The chemical composition of the binder, and operative and preferred proportions of gold and binder, are set forth in Table 1. Part or all of the $Cu_2O$ may be replaced by molar equivalent amounts of CuO. The glass in the binder is set forth in Table 2.

Table 1
Gold Compositions

| Component | Proportions (wt. %) Operative | Preferred |
|---|---|---|
| Gold | 95.0–98.1 | 96.1 |
| Binder | 1.9–5.0 | 3.9 |
| —$PbF_2$ | 0.3–1.5 | 1.1 |
| —$Cu_2O$ | 0.06–0.32 | 0.3 |
| —CdO | 0.2–1.5 | 1.1 |
| —Class | 0.5–1.95 | 1.4 |

Table 2
Glass in Gold Compositions of Table 1

| Component | Proportions (wt. %) Operative | Preferred |
|---|---|---|
| PbO | 45–52 | 48.5 |
| $B_2O_3$ | 3–6 | 3.0 |
| $SiO_2$ | 30–35 | 33.5 |
| $TiO_2$ | 4–6 | 5.5 |
| $ZrO_2$ | 2–4 | 2.7 |
| ZnO | 0–1 | 0.6 |
| $Na_2O$ | 1–4 | 2.5 |
| CdO | 0–4 | 2.4 |
| $Li_2O$ | 0–2 | 1.3 |

In these compositions there are normally 7–15 parts vehicle and complementally, 85–93 parts inorganic solids (gold plus inorganic binder), although these proportions may be varied depending upon printing properties and substrate coverage desired.

The fired conductors of this invention can be beam lead repairable and thermal compression bondable, and further can be more adherent after standing at elevated temperature for extended periods.

Detailed Description of the Invention

The glass in the inorganic binder used in this invention is prepared by conventional glass-making techniques, by mixing the desired components (or precursors thereof, e.g., $H_3BO_3$ for $B_2O_3$, etc.) in the desired proportions and heating the mixture to form a melt. As is well known in the art, heating is conducted to a peak temperature and for a time such that the melt becomes entirely liquid, yet no gaseous evolution is observed. The melt is then fritted (particles are made) by cooling the melt, typically by pouring onto a cold belt or into cold running water. Particle size reduction can then be accomplished by milling as desired.

The components of the inorganic binder are crystalline, except for the glass phase. It is thought that copper oxide and cadmium oxide are involved in chemical reactions responsible for adhesion and that $PbF_2$ contributes toward reducing firing temperature and cleaning the bonding surface. The glass serves to reduce firing temperature, provide latitude of firing temperature, and disperse bonding agents over the substrate surface (and, hence, enhance adhesion). Large amounts of copper oxide and/or $PbF_2$ lead to loss of thermal compression bondability. Large amounts of CdO cause reduced adhesion. Large amounts of glass reduce conductivity and beam lead repairability and bondability to beam leads and to bondability.

The gold powders of the present invention can contain up to 10% by weight palladium and/or platinum, without reducing adhesion and bonding characteristics.

The inorganic particles used in the compositions of this invention (noble metal powders and inorganic binder powders) are usually described as finely divided powders, and are generally sufficiently finely divided to pass through a 200-mesh screen, preferably a 400-mesh screen (U.S. standard sieve scale). Typically substantially all of the particles have dimensions in the range 0.01–10 microns, preferably 0.1–10 microns, more preferably 0.1–5 microns.

The metal and binder particles are mixed with an inert liquid vehicle by mechanical mixing (e.g., on a roll mill) to form a paste-like composition. The latter is printed as "thick film" on conventional dielectric substrates (such as alumina, sapphire, etc.) in the conventional manner. Any inert liquid may be used as the vehicle, such as water or any one of various organic liquids, with or without thickening and/or stabilizing agents and/or other common additives. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

The ratio of inert liquid vehicle to solids in the dispersions may vary considerably and depends upon the manner in which the dispersion is to be applied and the kind of vehicle used. In printing noble metal compositions with small amounts of inorganic binder it is often preferred to have a very high gold content in the composition to maximize coverage and film density. Hence, while broad proportions of solids to vehicle can be used with the inorganic materials of this invention, preferred compositions comprise the proportions of noble metal, binder, and vehicle set forth in the Summary of the Invention above. The compositions of the present invention may, of course, be modified by the addition of other materials which do not affect its beneficial characteristics. Furthermore, larger amounts of binder may be employed, at the sacrifice of certain electrical properties.

After drying to remove the inert vehicle, firing of the compositions of the present invention is carried out at temperatures and for times sufficient to sinter the inorganic materials and to produce conductor patterns adherent to the dielectric substrate. Depending upon the properties desired and composition used, peak firing temperatures are generally in the range 800°–1020° C., preferably 900°–950° C., most preferably at about 925° C., for durations less than 0.5 hour, and preferably for 5–20 minutes.

EXAMPLES

The following examples are presented to illustrate the invention. In the examples and throughout the specification and claims all percentages, proportions, ratios, etc., are by weight unless otherwise specifically stated.

Compositions were made using 89 parts of inorganic solids (gold and binder) in 11 parts of a vehicle of ethyl cellulose, rosin, and acrylate polymers in a solvent based on butyl acetate, terpineol, 2,2,4-trimethylpentanediol-1,3-monoisobutyrate, and dibutyl phthalate with a thixotropic agent. The glass used in each example was the preferred glass of Table 2; it was prepared by mixing the appropriate oxides or precursors thereof (e.g., $H_3BO_3$ for $B_2O_3$, $Li_2CO_3$ for $Li_2O$, etc.), in proportions so as to achieve the desired final oxide proportions. The glass precursor batch was melted to a temperature of about 1350° C., until fluid and no gaseous evolution was occurring. The melt was poured into cold running water to form a frit, then milled to a finely divided powder.

In each inorganic material used (gold and binder) substantially all the particles were greater than 0.1 micron and less than 5 microns in diameter. In each example, binder, noble metal, and vehicle were mixed on a roll mill; the resultant pasty composition was printed through a 325-mesh screen (U.S. standard sieve scale) on a dense (prefired) substrate. The screen had nine openings 0.08 inch (0.02 cm.) square aligned in a three-by-three matrix. The print was dried by placing the printed substrate in an oven preheated to 100°–150° C., for 10–15 min. The dried print was then fired as indicated in the examples to produce conductor pads. Where two or more peak firing temperatures are indicated for a single example below, it is meant that more than one substrate was printed, and then at least one substrate was heated to one of the indicated peak temperatures, while at least one other substrate was heated to the other indicated peak temperature(s).

EXAMPLE 1

The gold used was composed of spherical particles having diameters generally in the range 0.5–2 microns. A composition was prepared from 96.10 parts gold and 3.90 parts binder (1.11 parts $PbF_2$, 0.28 part $Cu_2O$, 1.11 parts CdO, and 1.40 parts glass). The composition was printed on dense 96% alumina substrates. The prints were dried at 135° C. for 15 min. to a thickness of about 20 microns.

A series of samples were placed in an oven preheated to the desired peak temperature, and the samples were held at that temperature for 10 min. The fired prints were about 15 microns thick.

Adhesion to the substrate of each sample, after firing, was determined as follows. Wire leads were attached to the pads by placing a 20-gauge (0.08 cm. diameter) pretinned copper wire across three of the pads, fluxing with organic chloride flux, and dipping into a solder pot of 12 In/70 Sn/18 Pb at about 250° C. Adhesion strengths were determined by pulling at 90° the soldered leads with a Chatillion or Instron strength tester. The gold pads fired at 925° C. were found to have 6.8 lbs. (3.1 kg.) adhesion, and those at 850° C. 5.8 lbs. (2.6 kg.). Four additional firings at 850° C. improved adhesion of the latter sample to 6.6 lbs. (3.0 kg.).

The samples which had been fired at either 850° C. or 925° C. were stored at 150° C. for 1000 hrs., but were still adherent (more than 6 lbs. or 3 kg.).

EXAMPLE 2

Gold patterns were printed and dried as in Example 1, but fired at respective peak temperatures of 850° C., 925° C., 985° C., and 1010° C. Thermal compression (TC) bonding characteristics of the fired prints were then examined. A Kulicke and Soffa Model 478 TC wire bonder was used at a relatively low bonding stage temperature of 250° C. using 60–80 g. pressure for the ball bond and 120–140 g. for the stitch bond. One mil (25 micron) diameter gold wire was bonded to the fired gold pads quickly. No precleaning of the gold pads was necessary.

The TC bonded gold wires were pulled and broke in the wire. The pads fired at 850° C. and 925° C. gave an average pull strength of 10 g. The pads fired at 985° C. and at 1010° C. gave the same strength.

EXAMPLE 3

Example 1 was repeated, except the substrate was 99.5% alumina. After firing at 925° C. pad strength was excellent (6.6 lbs. or 3.0 kg.).

EXAMPLE 4

The procedure of Example 1 was repeated, using a gold composition containing less binder. The inorganic solids contained 98.06% gold, 0.34% $PbF_2$, 0.17% $Cu_2O$, 0.57% CdO, and 0.86% glass. After firing at 850° C., adhesion was lower (2.3 lbs. or 1.0 kg.) than with larger amounts of binder.

EXAMPLE 5

The composition of Example 1 was printed on a glass-free substrate, sapphire, and beryllia. Gold pads fired on sapphire at 925° C. had adhesions greater than 6.2 lbs. (2.8 kg.), and pads fired at 850° C. on sapphire had adhesions greater than 6.6 lbs. (3.0 kg.). Adhesion to beryllia was 7.0 lbs. (3.2 kg.) after firing at 925° C. and 2.6 lbs. (1.2 kg.) after firing at 850° C.

COMPARATIVE SHOWING A

A composition not of the present invention (96.94% gold, 0.28% $Cu_2O$, and 2.78% glass) was found to perform poorly in thermal compression bonding tests. Thin fired prints were required (10 mils and below), versus up to 40 mils with the composition of Example 1. Firing temperature had to be at least 925° C., versus as low as 850° C. for Example 1.

We claim:

1. Conductor patterns of a composition of, by weight, 95.0–98.1% gold particles and, complementarily, 1.9–5.0% inorganic binder particles, the binder consisting essentially of, by total weight of gold and binder,
   0.3–1.5% crystalline $PbF_2$
   0.06–0.32% crystalline $Cu_2O$
   0.2–1.5% crystalline CdO and
   0.5–1.95% glass,
the glass having the composition
   45–52% PbO
   3–6% $B_2O_3$
   30–35% $SiO_2$
   4–6% $TiO_2$
   2–4% $ZrO_2$
   0–1% ZnO
   1–4% $Na_2O$
   0–4% CdO and
   0–2% $Li_2O$,
adherent to a dielectric substrate.

2. Conductor patterns according to claim 1 wherein the composition is of 96.1% gold and about 3.9% binder of
   1.1% $PbF_2$
   0.3% $Cu_2O$
   1.1% CdO and
   1.4% glass.

3. Conductor patterns according to claim 1 wherein the glass has the approximate composition
   48.5% PbO
   3.0% $B_2O_3$
   33.5% $SiO_2$
   5.5% $TiO_2$
   2.7% $ZrO_2$
   0.6% ZnO
   2.5% $Na_2O$
   2.4% CdO and
   1.3% $Li_2O$.

4. Conductor patterns according to claim 2 wherein the glass has the approximate composition
   48.5% PbO
   3.0% $B_2O_3$
   33.5% $SiO_2$
   5.5% $TiO_2$
   2.7% $ZrO_2$
   0.6% ZnO
   2.5% $Na_2O$
   2.4% CdO and
   1.3% $Li_2O$.

* * * * *